United States Patent [19]
Walker et al.

[11] 3,970,953
[45] July 20, 1976

[54] DISTORTION-FREE AMPLIFIERS

[75] Inventors: Peter James Walker, Hemingford Abbots; Michael Peter Albinson, Over, both of England

[73] Assignee: The Acoustical Manufacturing Company Limited, London, England

[22] Filed: Jan. 10, 1975

[21] Appl. No.: 539,954

[30] Foreign Application Priority Data
Jan. 17, 1974   United Kingdom.................. 2278/74

[52] U.S. Cl..................................... 330/99; 330/28; 330/84; 330/103; 330/105; 330/124 R; 330/149; 330/151
[51] Int. Cl.²......................................... H03F 1/34
[58] Field of Search................ 330/28, 30 R, 13, 99, 330/84, 103, 105, 124 R, 149, 151

[56]  References Cited
UNITED STATES PATENTS
2,751,442   6/1956   Ketchledge........................... 330/84

*Primary Examiner*—James B. Mullins
*Attorney, Agent, or Firm*—Robert F. O'Connell

[57]   ABSTRACT

A distortion-free amplifier for electric signals has a high-quality low-power amplifier-section. In addition there is a high-power amplifier-section which delivers the majority of the current to the load. A feedback signal is derived which is a measure of the output current of the high-power section and not the low-power section. The feedback signal is applied to the inputs of both amplifier-sections negatively in an amount such as to remove from the combined output currents in the load any distortion occurring in the contribution from the high-power section.

4 Claims, 3 Drawing Figures

DISTORTION-FREE AMPLIFIERS

The present invention relates to amplifiers, and is concerned mainly with audio-frequency amplifiers.

It is well known to provide audio frequency amplifiers which use the Class B configuration for the power output stage. Transistors having matched but complementary characteristics are sometimes used for such Class B configuration, or quasi-complementary circuits can be used to provide the necessary polarity inversion when using transistors with matched, like characteristics. The problem with all such circuits lies in matching the characteristics of the two halves of the output stage to provide a linear transfer characteristic particularly in the so-called crossover region. This entails accurate biasing adjustment and elaborate means to compensate for changes in the biasing due to thermal effects within the transistors.

The benefits of negative feedback in reducing distortion are limited and various other proposals have been made for use as an alternative or in addition to negative feedback. These are summarised in the article entitled "Reducing Amplifier Distortion" in Wireless World, pages 367 to 371, October 1974.

It is one object of the present invention to provide an improved amplifier for electric signals in which substantial simplification in circuit design can be achieved whilst effecting substantially completely distortion-free amplification.

It is a further object of the invention to provide an improved amplifier for electric signals in which the output stage can comprise a pair of heavy duty transistors without adjustable elements for dealing with the crossover and alignment problems and in which the amplifier can provide substantially distortion-free amplification.

It is yet another object of the invention to provide an improved amplifier for electric signals in which the output stage can comprise a pair of heavy duty transistors and in which substantially distortion-free amplification can be provided without change in performance due to changes in junction temperatures.

According to the present invention in one aspect there is provided apparatus for amplifying electric signals over a predetermined frequency band, comprising a first circuit adapted to deliver current directly to a load in response to and in proportion to an applied signal, a second circuit including an amplifier arranged, in response to the said applied signal, to deliver current to the said load through an impedance-element or network, a third circuit arranged to apply a feedback signal negatively from the amplifier side of the said element or network to the inputs of both the first and second circuits, the arrangement being such that, in operation, the current delivered to the load through the first circuit substantially cancels any distortion in the current delivered by the second circuit to the said load.

According to the present invention in a second aspect there is provided apparatus for amplifying electric signals over a predetermined frequency band, comprising first and second amplifier-sections coupled in cascade with the second section coupled through an impedance-element or network to a load, a circuit for applying a feedback signal negatively from the amplifier side of the said element or network to the input of the first amplifier section, and a shunt circuit from the output of the first amplifier section directly to the load and arranged for applying an output signal from the first amplifier-section to the load such as to effect substantially complete cancellation of any distortion produced in the load by the second amplifier-section.

The invention will now be described, by way of example, with reference to the accompanying drawings in which.

Figure 1:
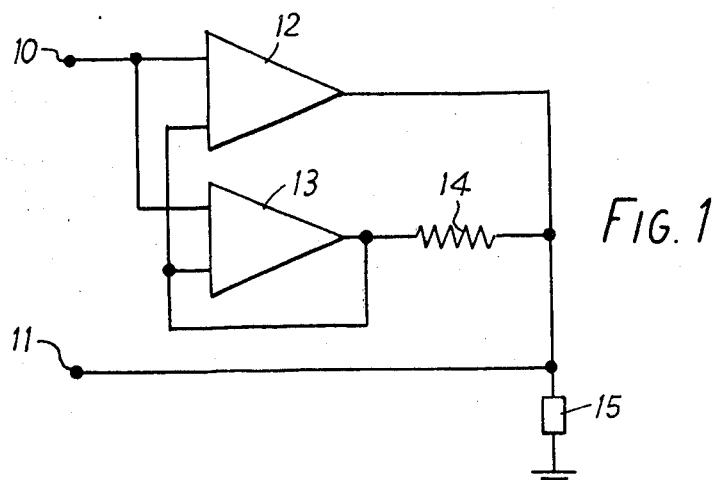
FIG. 1 is a block diagram of a first embodiment of the invention.

Referring to FIG. 1, apparatus for amplifying an input signal applied to input terminals 10 and 11 comprises a first amplifier 12 and a second amplifier 13. The output of the second amplifier 13 is connected through a resistor 14 to a load 15 and the output of the first amplifier 12 is connected direct to the load 15. The inputs of the two amplifiers 12 and 13 are in parallel, as shown. The input terminal 10 is connected direct to the amplifiers 12 and 13 and the input terminal 11 is connected to the amplifier side of the load 15. Also applied to the parallel inputs of the amplifiers is a feedback signal from the output of the amplifier-side of the resistor 14.

The first amplifier 12 is arranged to an operational amplifier of high quality which, by itself, is adapted to deliver current to the load 15 in response to and in proportion to an input signal applied between the input terminals 10 and 11, i.e. it is substantially distortion-free. The amplifier 12 is of low power but capable of operating without significant distortion over the full voltage swing concerned.

The second amplifier 13 is arranged to be of substantially greater power than the first and, by itself, delivers to the load 15 in response to the applied signal a current which contains a proportion of distortion of the applied signal which proportion is hereinafter referred to as the first proportion of distortion.

The output current of the second amplifier in traversing the resistor 14 generates a signal across it and this signal is fed back negatively through a circuit as shown to the inputs of both amplifiers 12 and 13.

The effect of the feedback on the current delivered direct to the load 15 by the amplifier 12 is to introduce into it distortion dependent upon the distortion in the feedback signal, i.e. dependent upon the said first proportion of distortion.

Assume for explanation purposes that the first proportion of distortion introduced by the amplifier 13 is 10% and that the negative feedback reduces this to 0.1% in current delivered by the amplifier 13 to the load 15. The current delivered direct to the load 15 from the amplifier 12 will contain a proportion of distortion (hereinafter referred to as the second proportion) substantially equal to 10% (in fact it will be 9.9%).

The distortion in the current delivered by the first amplifier 12 to the load 15 is arranged to be equal and opposite to the distortion in the current delivered by the second amplifier 13 whereby the composite current flowing through the load 15 is free of distortion.

Because the second proportion of distortion is much greater than the first proportion of distortion the current output of the first amplifier 12 can be small (one hundredth in this example) compared with that of the amplifier 13.

It can be shown that for a distortion-free current through the load 15 the resistance of the resistor 14 should be made equal to the reciprocal of the mutual conductance of the amplifier 12.

Thus the amplifier 13 can have, if desired, an output stage comprising a pair of heavy duty NPN transistors in push-pull and zero quiescent current — i.e. zero bias. Such an arrangement would normally cause a substantial degree of crossover distortion. Such distortion can be completely eliminated by the present invention. In addition the two transistors of the pair need not be matched. Any distortion caused by a mis-match can also be eliminated. It will be appreciated that all components can be of fixed values and initial setting up procedures are eliminated. If the transistor characteristics should vary due to changes in the temperatures of junctions no distortion arises in the load current.

It will be understood that when the amplifier 13 has a push-pull output stage it may also embody a distortion-free driver stage. Thus the output of the driver stage can be identical with the output of the amplifier 12. Thus the amplifier 12 can be dispensed with whereby the circuit of FIG. 1 evolves into the circuit shown in FIG. 2.

Figure 2:
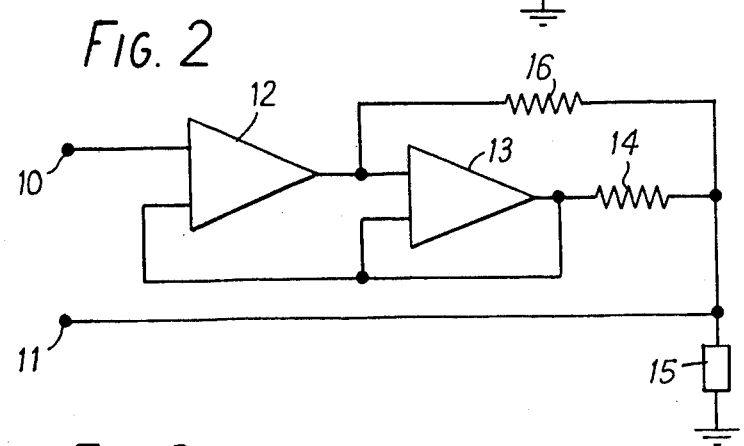
FIG. 2 is a block diagram of a second embodiment of the invention.

In FIG. 2 the amplifiers 12 and 13 are connected in cascade with the amplifier 13 coupled through the resistor 14 to the load 15. The feedback signal developed across the resistor 14 is fed back to the inputs of both the amplifier 12 and the amplifier 13. The output of the amplifier 12 is applied to the amplifier 13 and through a shunt circuit comprising the resistor 16 direct to the load 15.

Thus the shunt circuit 16 is adapted by itself to deliver current direct to the load in response to and in proportion to the applied signal. A second circuit including the amplifier 13 is arranged to deliver current to the load through the resistor 14. A third circuit (the feedback circuit) is arranged to apply a feedback signal negatively from the amplifier-side of the resistor 14 to the inputs of both amplifiers.

If the ratio of the ohmic values of the resistors 16 and 14 is made equal to the voltage amplification of the amplifier 12 the distorted portions of the currents in the resistors 16 and 14 will be equal and opposite. Thus the current flowing in the load will be substantially undistorted.

It will be appreciated that the input terminal 11 can be connected to ground instead of to the load. This has the effect of converting the amplifier from the constant current form to the constant voltage form, which is usually required, by the addition of overall voltage feedback without in any way altering the operation of the present invention.

The element 14 is shown in FIGS. 1 and 2 as a simple resistor but it will usually be a reactive element or network. This is required in accordance with normal feedback practice to stabilise operation with the overall feedback provided in the constant-voltage form.

Figure 3:
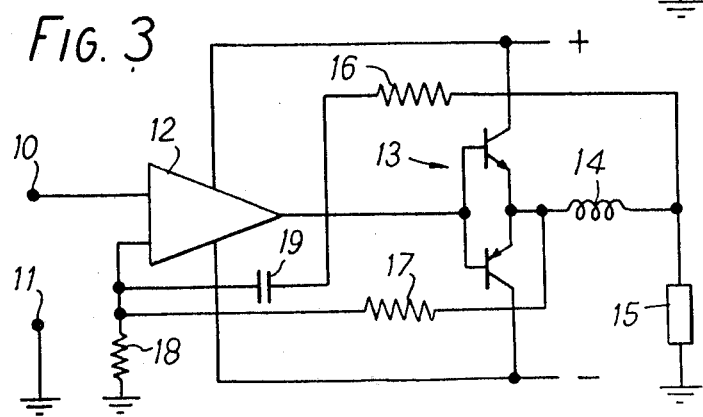
FIG. 3 is a circuit diagram showing in the form of a high quality amplifier a practical embodiment of the invention.

FIG. 3 shows a complete and practical embodiment of the invention based on FIG. 2 when modified into the constant-voltage form. The feedback circuit includes the resistors 17 and 18 and capacitor 19 and the element 14 is an inductor. It can be shown that if $Z_1$, $Z_2$, $Z_3$ and $Z_4$ represent the impedances of the elements 14, 19, 16 and 17 respectively, then, by making $Z_1Z_2 = Z_3Z_4$ none of the distortion produced by the amplifier 13 appears in the load. In FIG. 3 $Z_1$ is inductive and $Z_2$ is capacitive and $Z_3$ and $Z_4$ are resistive. The impedances $Z_1$ to $Z_4$ can take other forms which may be simple elements or complex networks provided $Z_1 Z_2 = Z_3 Z_4$ holds for the band of frequencies concerned.

Another way in which the operation of the circuit can be viewed is as follows:

Current drawn from the amplifier 12 by the load "turns on" the heavy duty transistors in the amplifier 13. Thus the latter act as heavy duty current "dumping" transistors which then contribute the major part of the output current. The "dumping" current is separately monitored by the element or network 14 and a feedback signal is generated. This signal is fed back to the common input in an amount such that the transfer function of the apparatus is independent of the performance of the amplifier 13.

We claim:
1. Apparatus for amplifying electric signals comprising,
   a first amplifier-section,
   a second amplifier-section,
   means coupling said first and second amplifier-sections in cascade,
   a load for the apparatus,
   a feedback-generating first impedance means,
   means connecting the output of said second amplifier-section through said first impedance means to said load,
   a shunt circuit from the output of said first amplifier-section shunting said second amplifier-section to deliver current direct to said load, from said first amplifier-section,
   and a negative feedback circuit for supplying negative feedback signals from the amplifier-side of said first impedance means to the inputs of said first and second amplifier-sections.

2. Apparatus as claimed in claim 1, wherein one input terminal is connected to one input terminal of said first amplifier-section and the other input terminal is connected to the other input terminal of said first amplifier-section and to the end of said load remote from said second amplifier-section, wherein said negative feedback circuit comprises a fourth impedance means for supplying said negative feedback signals to said first amplifier section and a second impedance means connected in series with said fourth impedance means for supplying said negative feedback signals to said second amplifier-section wherein a third impedance means is connected in series in said shunt circuit, and further wherein $Z_1Z_2 = Z_3Z_4$ where $Z_1$, $Z_2$, $Z_3$ and $Z_4$ are respectively the impedances over the said frequency band of the said first, second, third and fourth impedance means.

3. Apparatus as claimed in claim 2, and wherein said first impedance-means is inductive and said second impedance-means is capacitive.

4. Apparatus for amplifying electric signals comprising,
   a first amplifier of relatively small power,
   a load,
   means connecting the output of said first amplifier to said load,
   a second amplifier of relatively large power connected to said load to be turned on by output from said first amplifier and contribute current to the load,
   means to monitor current flowing from said second amplifier to said load,
   and means to feed back a signal from said monitoring means to the inputs of both said amplifiers to maintain the transfer characteristic of the apparatus independent of the performance of said second amplifier.

* * * * *